US007903496B2

(12) United States Patent
Lee (10) Patent No.: US 7,903,496 B2
(45) Date of Patent: Mar. 8, 2011

(54) SEMICONDUCTOR MEMORY DEVICE (75) Inventor: Sang-Hee Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 187 days.

(21) Appl. No.: 11/478,302

(22) Filed: Jun. 30, 2006

(65) Prior Publication Data

US 2007/0070776 A1 Mar. 29, 2007

(30) Foreign Application Priority Data

Sep. 29, 2005 (KR) .................. 10-2005-0090896
Dec. 2, 2005 (KR) .................. 10-2005-0117135

(51) Int. Cl.
*G11C 8/18* (2006.01)

(52) U.S. Cl. ............ 365/230.03; 365/230.08; 365/226; 365/227; 365/229

(58) Field of Classification Search ........... 365/230.03, 365/233.13, 203, 230.08, 226, 227, 229
See application file for complete search history.

(56) References Cited

U.S. PATENT DOCUMENTS

| 5,345,405 A * | 9/1994 | Walsh et al. .................. 708/211 |
|---|---|---|
| 5,631,871 A * | 5/1997 | Park et al. ...................... 365/203 |
| 5,694,361 A * | 12/1997 | Uchida ..................... 365/189.05 |
| 5,764,584 A * | 6/1998 | Fukiage et al. .......... 365/230.03 |
| 5,953,280 A | 9/1999 | Matsui |
| 5,999,472 A | 12/1999 | Sakurai |
| 6,215,719 B1 | 4/2001 | Anraku |
| 6,477,598 B1 | 11/2002 | Yu |
| 6,842,382 B2 | 1/2005 | Kim et al. |
| 7,064,992 B2 * | 6/2006 | Bell et al. ........................ 365/203 |
| 2002/0003736 A1 * | 1/2002 | Fujisawa et al. ............... 365/203 |
| 2003/0179639 A1 * | 9/2003 | Bell et al. ................. 365/230.08 |
| 2005/0243608 A1 * | 11/2005 | Lee .......................... 365/189.01 |
| 2006/0056268 A1 * | 3/2006 | Chun ...................... 365/230.08 |

FOREIGN PATENT DOCUMENTS

JP 2000-132968 A 5/2000

* cited by examiner

*Primary Examiner* — Hoai V Ho
*Assistant Examiner* — Jay Radke
(74) *Attorney, Agent, or Firm* — IP & T Group LLP (57) ABSTRACT

A semiconductor device reduces unnecessary operating current while an internal row/column address is generated. The semiconductor memory device includes an address input unit for transferring an address signal input from an external device; an internal column address generating unit for receiving the transferred address signal to generate an internal column address; an internal row address generating unit for receiving the transferred address signal to generate an internal row address; and an internal address control unit for controlling the internal row address generating unit in response to an activated states of banks in the semiconductor memory device.

8 Claims, 7 Drawing Sheets

SEMICONDUCTOR MEMORY DEVICE

FIELD OF THE INVENTION

The present invention relates to a semiconductor memory device, and more particularly to a semiconductor memory device for accessing data in response to row addresses and column addresses.

DESCRIPTION OF RELATED ARTS

Generally, a semiconductor device receives address signals and inputs or outputs data in response to the received address signals. The semiconductor device has a plurality of address input units for respectively receiving address signals and transferring them to an internal circuit.

Figure 1:
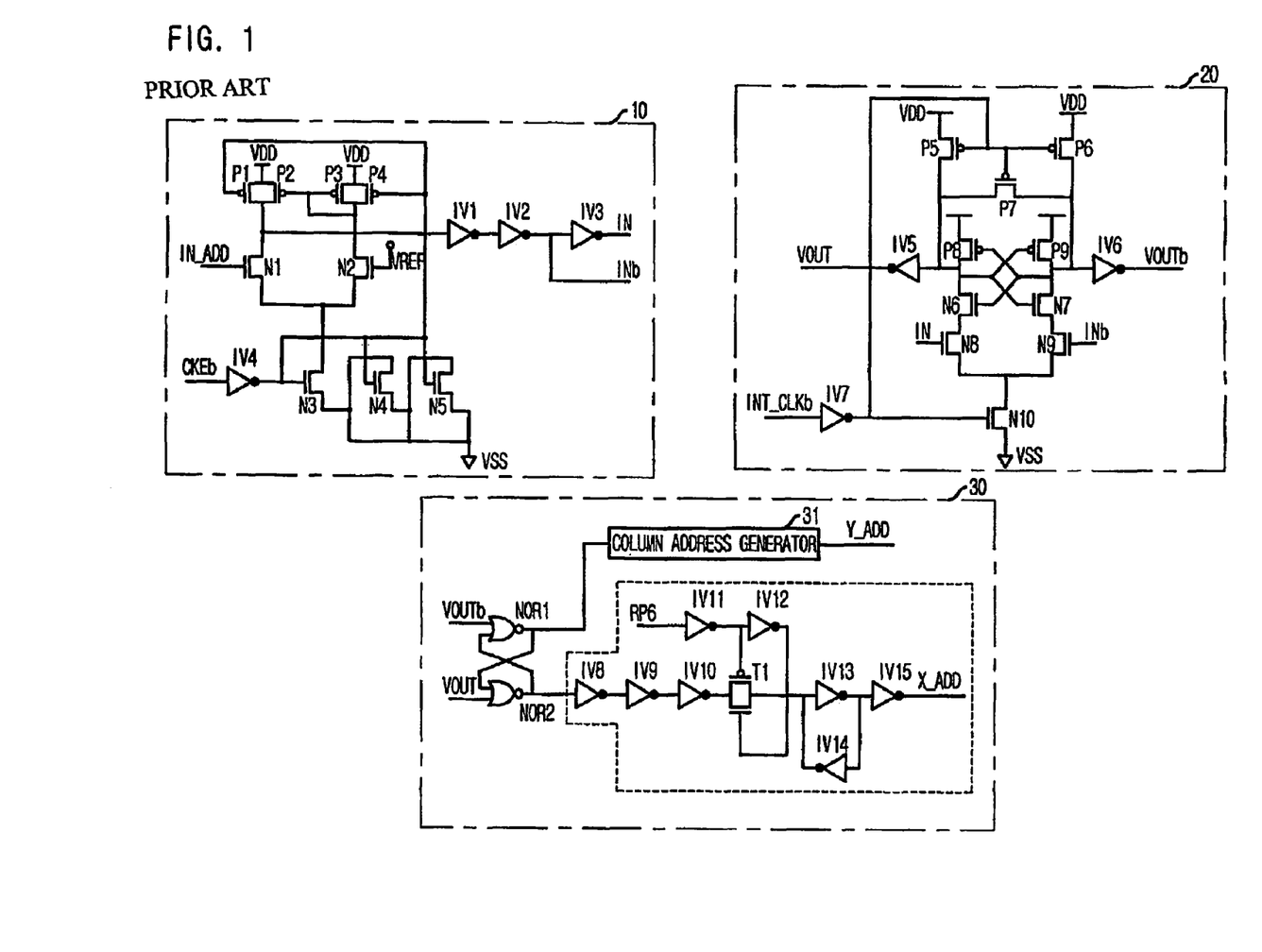
FIG. 1 is a schematic circuit diagram of a conventional semiconductor memory device.

FIG. 1 is a schematic diagram showing an address input block for use in a conventional semiconductor memory device.

The address input block for use in the conventional semiconductor memory device includes an address buffer unit 10, an address latch unit 20 and a global address generating unit 30.

The address buffer unit 10 includes PMOS transistors P1 to P4, NMOS transistors N1 to N5 and inverters IV1 to IV4. The address buffer unit 10 compares an input address signal IN_ADD to a reference signal VREF in response to an activating timing of a clock enable signal CKEb, and generates output signals IN and INb as a comparison result wherein two output signals IN and INb have an opposite logic level respectively to each other. The input address signal IN_ADD is a signal input through an input address pad of the semiconductor memory device. The input address pad is arranged for transferring from an external device to an internal circuit an address signal input for selecting a word line of a plurality of word lines or a bit line of a plurality of bit lines in the semiconductor memory device.

The address latch unit 20 includes PMOS transistors P5 to P9, NMOS transistors N6 to N10 and inverters IV5 to IV7. The address latch unit 20 latches the signal IN and INb output from the address buffer unit 10 to generate output signals VOUT and VOUTb wherein two output signals VOUT and VOUTb have opposite logic levels.

The global address generating unit 30 includes logic gates NOR1 and NOR2, a column address generating unit 31 and a row address generating unit 32. The row address generating unit 32 includes inverters IV8~IV15 and a transmission gate T1. Each of the logic gates NOR1 and NOR2 has an output terminal cross coupled respectively to an input terminal of the other and has the other input terminal respectively for inputting the output signals VOUT and VOUTb. The logic gate NOR1 outputs an output signal to the column address generating unit 31 and the logic gate NOR2 outputs an output signal to the row address generating unit 32.

The column address generating unit 31 receives the output signal output from the logic gate NOR1 to generate an internal column address Y_ADD. The inverters IV8 to IV10 invert and delay the output signal output from the logic gate NOR2 to transfer to the transmission gate T1. The transmission gate T1 transfers the output of the inverter IV10 in response to a row command signal RP6. The row command signal RP6 is an activated signal generated in response to an active command input to the semiconductor memory device. A latch consisting of an inverter IV13 and IV14 latches the transferred signal transferred from the transmission gate T1. The inverter IV15 inverts the signal latched by the latch to thereby output an internal row address X_ADD.

The address buffer unit 10 is enabled in response to an enable state of the clock enable signal CKEb. Because the clock enable signal CKEb is in a disabled state when a Power down Mode is on or a Self Refresh Mode is on, the address buffer unit 10 is disabled in the Power down Mode or the Self Refresh Mode.

The global address generating unit 30 has two paths for respectively generating the internal column address Y_ADD and the internal row address X_ADD. The global address generating unit 30 uses just the row command signal RP6 to control one path for generating the row address X_ADD. Also, the global address generating unit 30 must uses an unnecessary path, i.e., the inverters IV8 to IV10, for generating the internal row address X_ADD. That is, because of unnecessary toggling of the inverters IV8 to IV10, unnecessary current is consumed. Generally, the semiconductor memory device uses more than inverters in FIG. 1 for generating the internal row address. Therefore, more unnecessary current consumption is wasted.

For setting a Mode Register Set, the path for the row address is used. When at first all banks in the semiconductor memory device are activated, the mode Register Set is set and the read/write operation is carried out, resulting in even greater unnecessary current consumption than described above. This description is applicable to, for example, a Burst Mode operating current mode, i.e., IDD4R pattern, IDD4W pattern.

SUMMARY OF THE INVENTION

Embodiments of the present invention are applicable to a semiconductor device capable of reducing an unnecessary operating current while an internal row/column address is generated.

In accordance with an aspect of the present invention, there is provided a semiconductor memory device, including: an address input unit for transferring an address signal input from an external device; an internal column address generating unit for receiving the transferred address signal to generate an internal column address; an internal row address generating unit for receiving the transferred address signal to generate an internal row address; and an internal address control unit for controlling the internal row address generating unit in response to an activated states of banks in the semiconductor memory device.

In accordance with another aspect of the present invention, there is provided a semiconductor memory device, including: an address input unit for transferring an address signal input from an external device; an internal column address generating unit for receiving the transferred address signal to generate an internal column address; an internal row address generating unit for receiving the transferred address signal to generate an internal row address; and an address control unit for inactivating the address input unit in response to a first data output mode or a second data output mode.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with specific embodiments of the present invention will be described in detail referring to the accompanying drawings.

Figure 2:
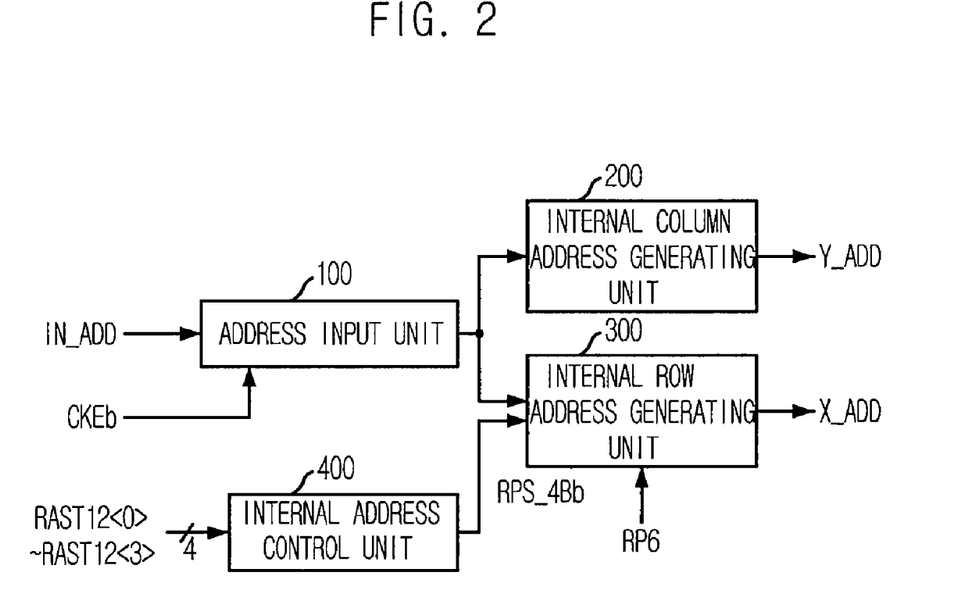
FIG. 2 is a block diagram of a semiconductor memory device in accordance with a first embodiment of the present invention.

FIG. 2 is a block diagram showing a semiconductor memory device in accordance with a first embodiment of the present invention.

The semiconductor memory includes an address input unit 100 for transferring an address signal IN_ADD input from an external device (not shown), an internal column address generating unit 200 for receiving the transferred address signal to thereby generate an internal column address Y_ADD, an internal row address generating unit 300 for receiving the transferred address signal to thereby generate an internal row address X_ADD and an internal address control unit 400 for controlling the internal row address generating unit 300 in response to activated states of banks in the semiconductor memory device.

The address input unit 100 receives and transfers the address signal IN_ADD to the internal column address generating unit 200 or the internal row address generating unit 300 in response to the clock enable signal CEKb. The internal column address generating unit 200 generates the internal column address Y_ADD with the address signal transferred by the address input unit 100. The internal row address generating unit 300 generates the internal row address X_ADD with the address signal transferred by the address input unit 100 in response to a row command signal RP6. The internal address control unit 400 controls the internal row address generating unit 300 to inactivate in response to the bank active signals RAST12<0>~RAST12<3>. Considering that the semiconductor memory device has four banks, the bank active signals RAST12<0>~RAST12<3> are activated respectively when banks corresponding with the bank active signals RAST12<0>~RAST12<3> are in an active state.

That is, the internal address control unit 400 generates the control signal RPS_4Bb for inactivating the internal row address generating unit 300 for activated states of banks in the semiconductor memory device. The control signal RPS_4Bb is activated in response to at least an inactive state of one bank of all banks in the semiconductor memory device. The control signal RPS_4Bb may be activated in response to a transition to the read operation or the write operation.

Figure 3:
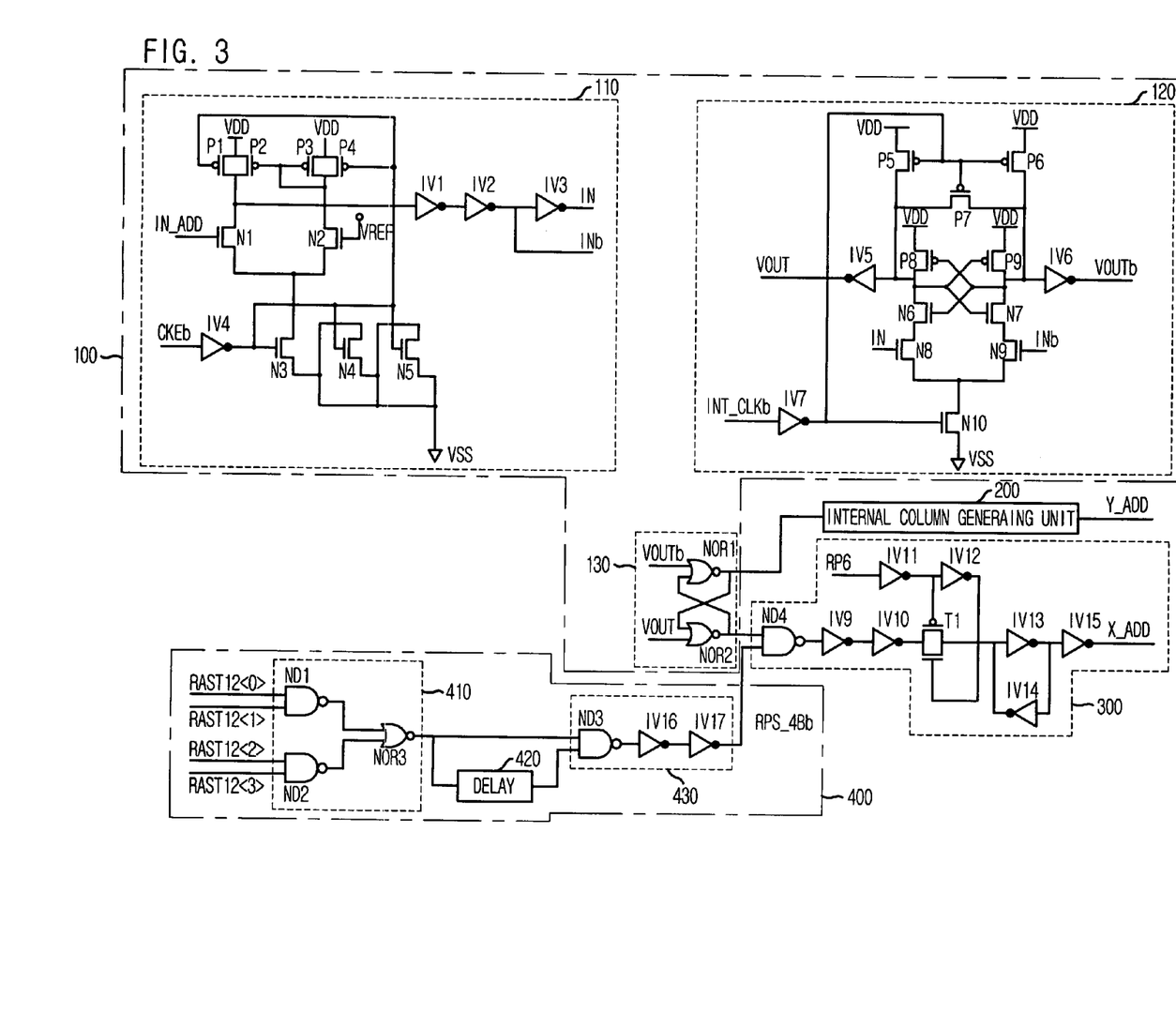
FIG. 3 is a schematic circuit diagram of a semiconductor memory device in accordance with the first embodiment of the present invention.

FIG. 3 is a schematic circuit diagram of a semiconductor memory device in accordance with the first embodiment of the present invention.

The address input unit 100 includes an address buffer unit 110, an address latch unit 120 and an address transfer unit 130.

The address buffer unit 110 includes PMOS transistors P1 to P4, NMOS transistors N1 to N5 and inverters IV1 to IV4. The address buffer unit 110 compares an input address signal IN_ADD and a reference signal VREF in response to an activating timing of a clock enable signal CKEb, and generates output signals IN and INb as a comparison result wherein two output signals IN and INb have opposite logic levels. The input address signal IN_ADD is a signal input through an input address pad of the semiconductor memory device. The input address pad is arranged for transferring from an external device to an internal circuit an address signal input for selecting a word line of a plurality of word lines or a bit line of a plurality of bit lines in the semiconductor memory device.

The address latch unit 120 includes PMOS transistors P5 to P9, NMOS transistors N6 to N10 and inverters IV5 to IV7. The address latch unit 120 latches the signal IN and INb output from the address buffer unit 110 to generate output signals VOUT and VOUTb wherein two output signals VOUT and VOUTb have opposite logic levels. The inverter IV7 inverts the internal clock INT_CLKb to output an enable signal for activating the address latch unit 120.

The address transfer unit 130 includes logic gates NOR1 and NOR2. Each of the logic gates NOR1 and NOR2 has an output terminal cross-coupled respectively to an input terminal of the other and has the other input terminal for respectively outputting one of the output signals VOUT and VOUTb. The logic gate NOR1 outputs an output signal into the column address generating unit 200 and the logic gate NOR2 outputs an output signal into the row address generating unit 300.

The column address generating unit 200 receives the output signal output from the logic gate NOR1 to generate an internal column address Y_ADD.

The row address generating unit 300 includes a NAND logic gate ND4, inverters IV9~IV15 and a transmission gate T1. The NAND logic gate ND4 inverts the output signal output from the logic gate NOR2 to the inverter IV9 when the output from the internal address control unit 400 is a logic level 'HIGH'. The inverters IV9 and IV10 invert and delay the output signal from the NAND logic gate ND4 to transfer the transmission gate T1. The transmission gate T1 transfers the output of the inverter IV10 in response to a row command signal RP6. The row command signal RP6 is an activated signal generated in response to an active command input to the semiconductor memory device. A latch, consisting of an inverter IV13 and IV14, latches the transferred signal transferred from the transmission gate T1. The inverter IV15 inverts the signal latched by the latch IV13 and IV14 to thereby output an internal row address X_ADD.

The internal address control unit 400 includes a first logical operating unit 410 for performing a logical operation of a plurality of bank active signals, a delay unit 420 for delaying a first output received from the first logic operating unit 410 to thereby output a second output applied to a second logic operating unit 430 for performing a logical operation of the first output and the second output to thereby output a control signal RPS_4Bb for controlling the internal row address generating unit to activate.

The first logical operating unit 410 includes a NAND logic gate ND1 for performing a NAND logical operation of a first bank active signal RAST12<0> and a second bank active signal RAST12<1>, a NAND logic gate ND2 for performing a NAND logical operation of a third bank active signal RAST12<2> and a fourth bank active signal RAST12<3> and a NOR logic gate NOR3 for performing a NOR logical operation of an output of the first NAND logic gate ND1 and an output of the second NAND logic gate ND2.

The second logical operating unit 430 includes a NAND logic gate ND3 for performing NAND logical operation of the first output and the second output and a buffering unit IV16 and IV17 for buffering an output of the NAND logic gate ND3 to thereby output the control signal RPS_4Bb.

The control signal RPS_4Bb is inactivated as a logical level 'LOW' when all banks of the semiconductor memory device are active and is activated as a logical level 'HIGH' when at least one bank of the semiconductor memory device is inactive.

Hereinafter, referring to FIG. 2 and FIG. 3, the operation of the semiconductor memory device in accordance with the first embodiment of the present invention will be explained in detail.

The semiconductor memory device in accordance with the first embodiment of the present invention has fourteen address pads for inputting address signals. The address pads are used in common for inputting row address signals or inputting column address signals.

At first, when the semiconductor memory device receives an address signal IN_ADD as a row address and generates the internal row address signal X_ADD, the address input unit 100 and the internal row address generating unit 300 is used. The address buffer unit 110 receives a row address signal IN_ADD input from an external device to thereby transfer it to the address latch 120 in response to the clock enable signal CKEb. The address latch 120 latches the transferred signals IN and INb to transfer them to the address transfer unit 130 in response to the internal clock signal INT_CLKb. The address input unit 130 receives the transferred signals VOUTb and VOUT to transfer them to the internal row address generating unit 300. Thereafter, the internal row address generating unit 300 generates the internal row address X_ADD using the signals transferred from the address input unit 130.

When the semiconductor memory device receives an address signal IN_ADD as a column address and generates the internal column address signal Y_ADD, the address input unit 100 and the internal column address generating unit 200 is used.

The internal address control unit 400 controls the internal row address generating unit 300 to inactivate in response to an activated state of a bank in the semiconductor memory device. The internal address control unit 400 generates the activated control signal RPS_4Bb in response to the bank active signals RAST12<0>~RAST12<3>. The internal row address generating unit 300 is inactivated in response to the activated control signal RPS_4Bb.

The internal address control unit 400 generates the activated control signal RPS_4Bb when at least an activated signal of the bank active signals RAST12<0>~RAST12<3> is activated. Therefore, the internal row address generating unit 300 is inactivated in response to an inactivated state of at least one bank of all the banks. In this case, the row addresses are input through the address pads and an operation on the row addresses is completed. Thereafter, the addresses input through the address pads are column addresses.

The semiconductor memory device in accordance with the first embodiment of the present invention controls the internal row address generating unit 300 to inactivate when the addresses input through the address pads are column addresses. Therefore, unnecessary current consumption during address inputting is reduced.

On the other hand, when the input timing of the bank active signals RAST12<0>~RAST12<3> is faster than that of the row command signal RP6, a latched address in the internal row address generating unit 300 can be changeable. The delay 420 serves to solve the problem. The internal address control unit 400 generates the control signal RPS_4Bb using the bank active signals RAST12<0>~RAST12<3> after a predetermined timing by the delay 420.

The internal address control unit 400 activates the control signal RPS_4Bb in response to at least one inactivated signal of the bank active signals RAST12<0>~RAST12<3>. The internal row address generating unit 300 is activated in response to the activated state of the control signal RPS_4Bb.

Figure 4:
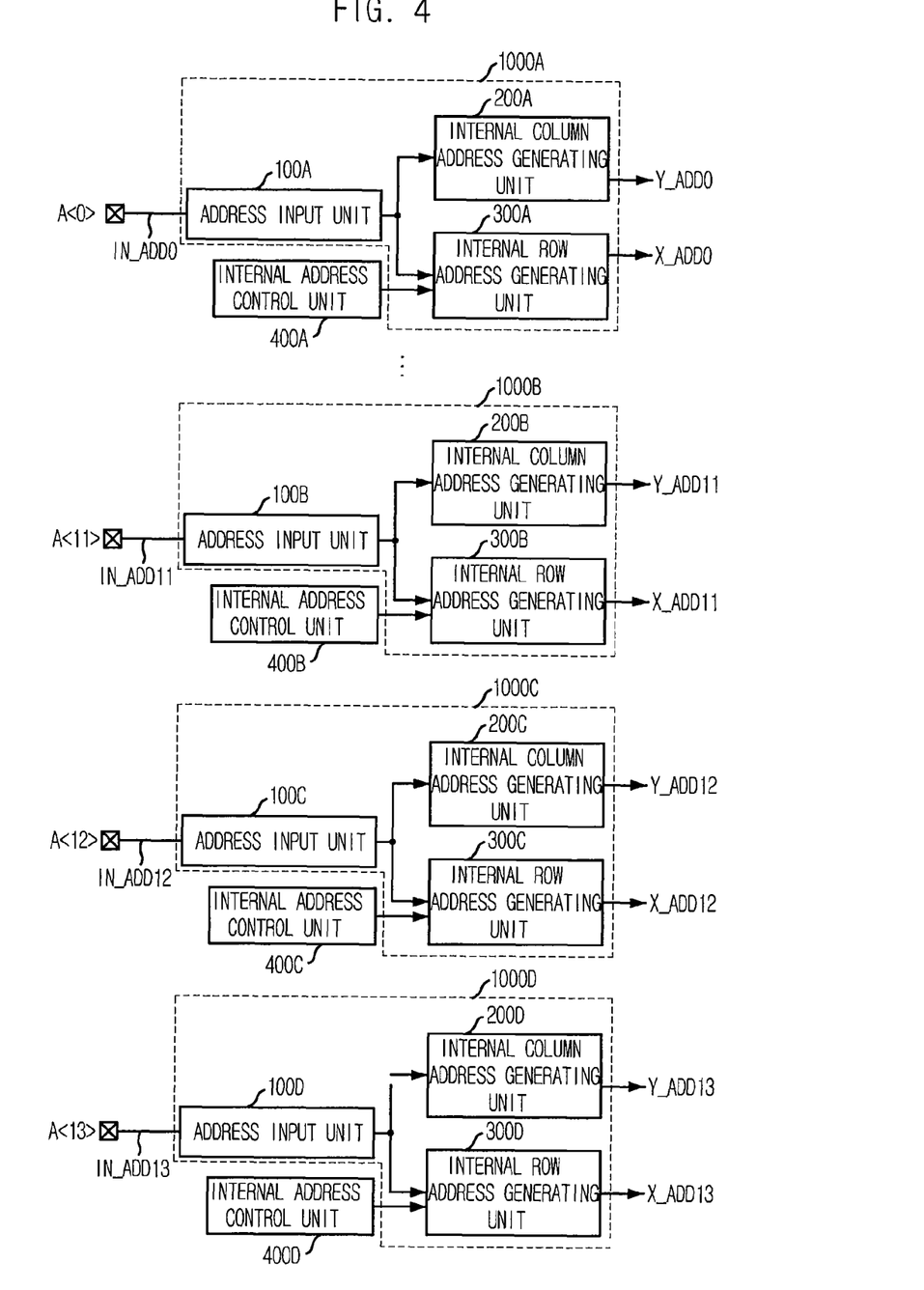
FIG. 4 is a block diagram of a semiconductor memory device in accordance with a second embodiment of the present invention.

The internal address control unit 400 can control the internal row address generating unit to inactivate in response to an activated state of all banks in the semiconductor memory device FIG. 4 is a block diagram of a semiconductor memory device in accordance with a second embodiment of the present invention.

The semiconductor memory device includes a first address input block 1000A for receiving a first address IN_ADD0 to generate a first internal column address Y_ADD0 or a first internal row address X_ADD0, a second address input block 1000B for receiving a second address IN_ADD11 corresponding to a first data output mode to generate a second internal column address Y_ADD11 or a second internal row address X_ADD11, a third address input unit 1000C for receiving a third address IN_ADD12 to generate a third internal column address Y_ADD12 or a third internal row address X_ADD12, a fourth address input unit 1000D for receiving a fourth address IN_ADD13 corresponding to the first data output mode or a second data output mode to generate a fourth internal column address Y_ADD13 or a fourth internal row address X_ADD13 and address control units 400A to 400D for selectively inactivating address input units 1000B, 1000C and 1000D in response to data output modes, respectively.

The first address input block 1000A is substantially the same as the address input unit 100 described in FIG. 3. That is, an address buffer unit 100A of FIG. 4 comprises an address buffer unit 110, an address latch unit 120, and an address transfer unit 130 as described in FIG. 3. Furthermore, internal column address generating unit 200A and internal row address generating unit 300A are the same as internal column generating unit 200 and row address generating unit 300 of FIG. 3 respectively. Also, other address input blocks (not shown) respectively coupled to the address input pads <A1> to <A10> are the same as the first address input block 1000A.

Each of the first to the fourth address input blocks 1000A to 1000D selectively receives a row address or a column address through corresponding address input pads, i.e., A<0>, A<11>, A<12> and A<13>, respectively. If the input address IN_ADD0 is a row address, the first address input unit 1000A generates the first internal row address X_ADD0 using the input address IN_ADD0. Alternatively, if the input address IN_ADD0 is a column address, the first address input unit 1000A generates the first internal column address Y_ADD0 using the input address IN_ADD0.

When the row addresses are input to the memory semiconductor device, 14-bit row addresses are input through address input pads A<0> to <A13>. Therefore, all the fourteen address input blocks are used for receiving 14-bit row addresses and generate 14-bit signals of the internal row addresses X_ADD0 to X_ADD13, respectively.

In addition, 4-bit data are output every operation of data access at the first data output mode; 8-bit data are output every operation of data access at the second data output mode. Also, 16-bit data are output every data access operation at a third data output mode.

As the number of bit data output at every operation of data access becomes higher, the number of column addresses bits needed decreases. There are more address input blocks at the first data output mode than at the second data output mode.

In cases of the first data output mode, i.e., 4-bit data output mode, 14-bit column addresses are input through the address input pads A<0> to A<13>. Then, all the fourteen address input blocks respectively coupled to address input pads A<0> to <A13> are used for receiving the 14-bit column addresses and generates 14-bit internal row addresses Y_ADD0 to Y_ADD13, respectively.

In cases of the second data output mode, i.e., 8-bit data output mode, 13-bit column addresses are input through the address input pads A<0> to A<10>, A<12> and A<13>. Then, the thirteen address input blocks respectively coupled to address input pads <A0> to A<10>, A<12> and <A13> are used for receiving the 13-bit column addresses and generates 13-bit internal row addresses Y_ADD0 to Y_ADD10, Y_ADD12 and Y_ADD13, respectively.

In cases of the third data output mode, i.e., 16-bit data output mode, 12-bit column addresses are input through the address input pads A<0> to A<10> and A<12> the twelve address input blocks respectively coupled to the address input pads <A0> to A<10> and <A12> are used for receiving the 12 bits column addresses and generates the 12 bits internal row addresses Y_ADD0 to Y_ADD10 and Y_ADD12, respectively.

According to a selected one of the first data output mode to the third data output mode, a first address control unit 400A, a second address control unit 400B, a third address control unit 400C and a fourth address control unit 400D selectively enables address input blocks 1000A to 1000D, respectively.

Therefore, an address input block that does not receive a column address at some data output mode is not enabled. As a result, it is possible to reduce the current consumption in the receipt of addresses, in particular column addresses.

Figure 5:
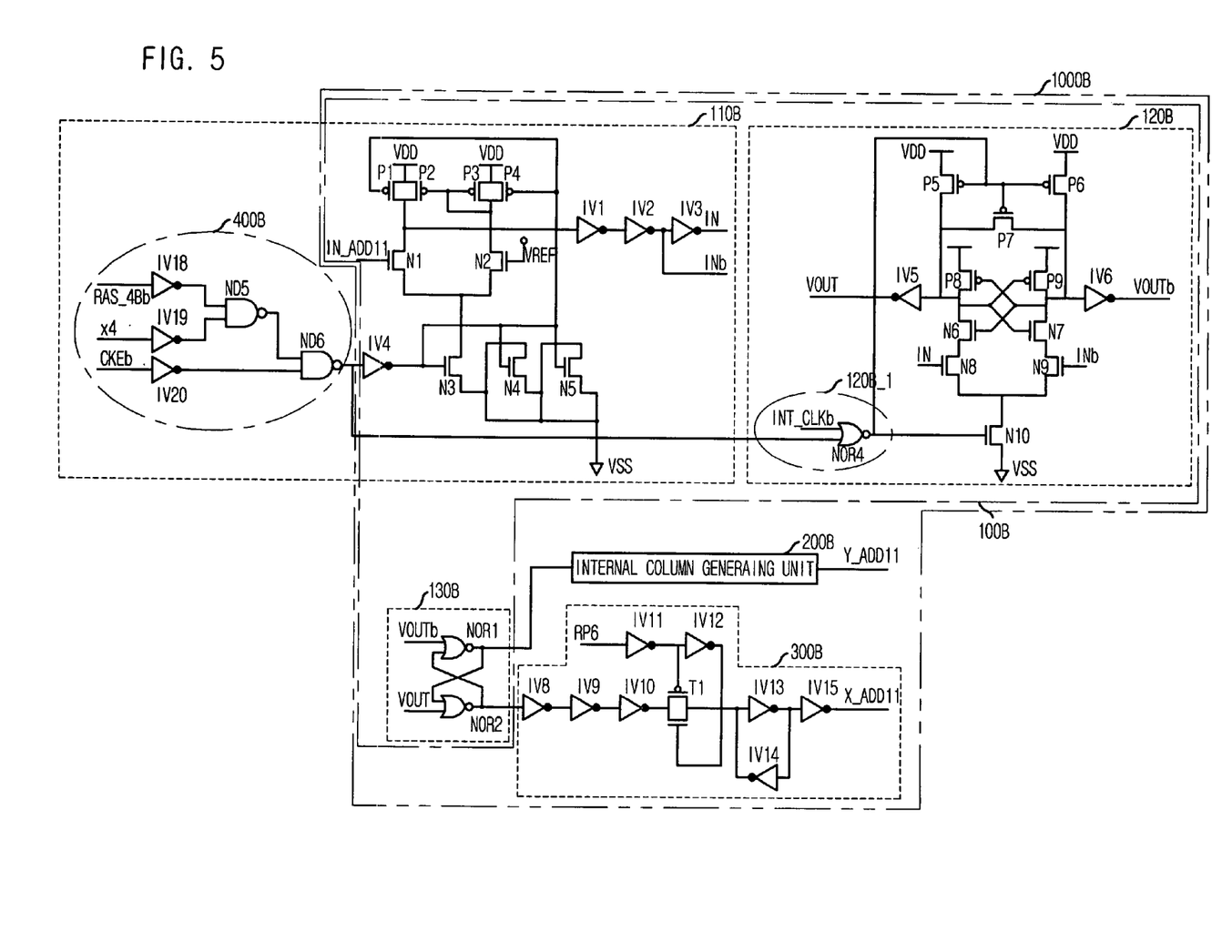
FIG. 5 describes a schematic circuit diagram of a second address input block in FIG. 4.

FIG. 5 is a schematic circuit diagram of a second address input block in FIG. 4.

As shown in FIG. 5, the second address input block 1000B includes an address input unit 100B for transferring the address signal IN_ADD11 input from an external device, an internal column address generating unit 200B for receiving the transferred address signal by the address input unit 100B to generate the internal column address Y_ADD11, and an internal row address generating unit 300B for receiving the transferred address signal to generate the internal row address X_ADDD11. The second address control unit 400B selectively inactivates the address input block 1000B in response to the first data output mode.

The second address control unit 400B includes a first inverter IV18 for inverting a row address control signal RAS_4Bb, a second inverter IV19 for inverting a first data output mode control signal X4 wherein the first data output mode control signal X4 is activated at the first data output mode, a third inverter IV20 for inverting the clock enable signal CKEb, a first NAND logic gate ND5 for performing a NAND logical operation with outputs of the first inverter IV18 and the second inverter IV19 and a second NAND logic gate ND6 for performing a NAND logical operation with outputs of the first NAND logic gate ND5 and the third inverter IV20.

The row address control signal RAS_4Bb is a control signal inactivated when any one of all banks initiates a precharge mode. That is, when all the banks are at an active mode, the row address control signal RAS_4Bb is maintained as activated state.

The address control unit 400B controls the address input block 1000B to inactivate at the second data output mode. The address control unit 400B does not transfer the clock enable signal CKEb to the address input unit 100B in response to the first data output mode control signal X4 at the second data output mode. An address input unit 110B of the address input unit 100B is operated in response to the transferred clock enable signal CKEb by the address control unit 400B. An address latch unit 120B is operated in response to an output of a latch control unit 120B_1 wherein the latch control unit 120B_1 transfers the internal clock signal INT_CLKb in response to the clock enable signal CKEb transferred by the address control unit 400B.

Figure 6:
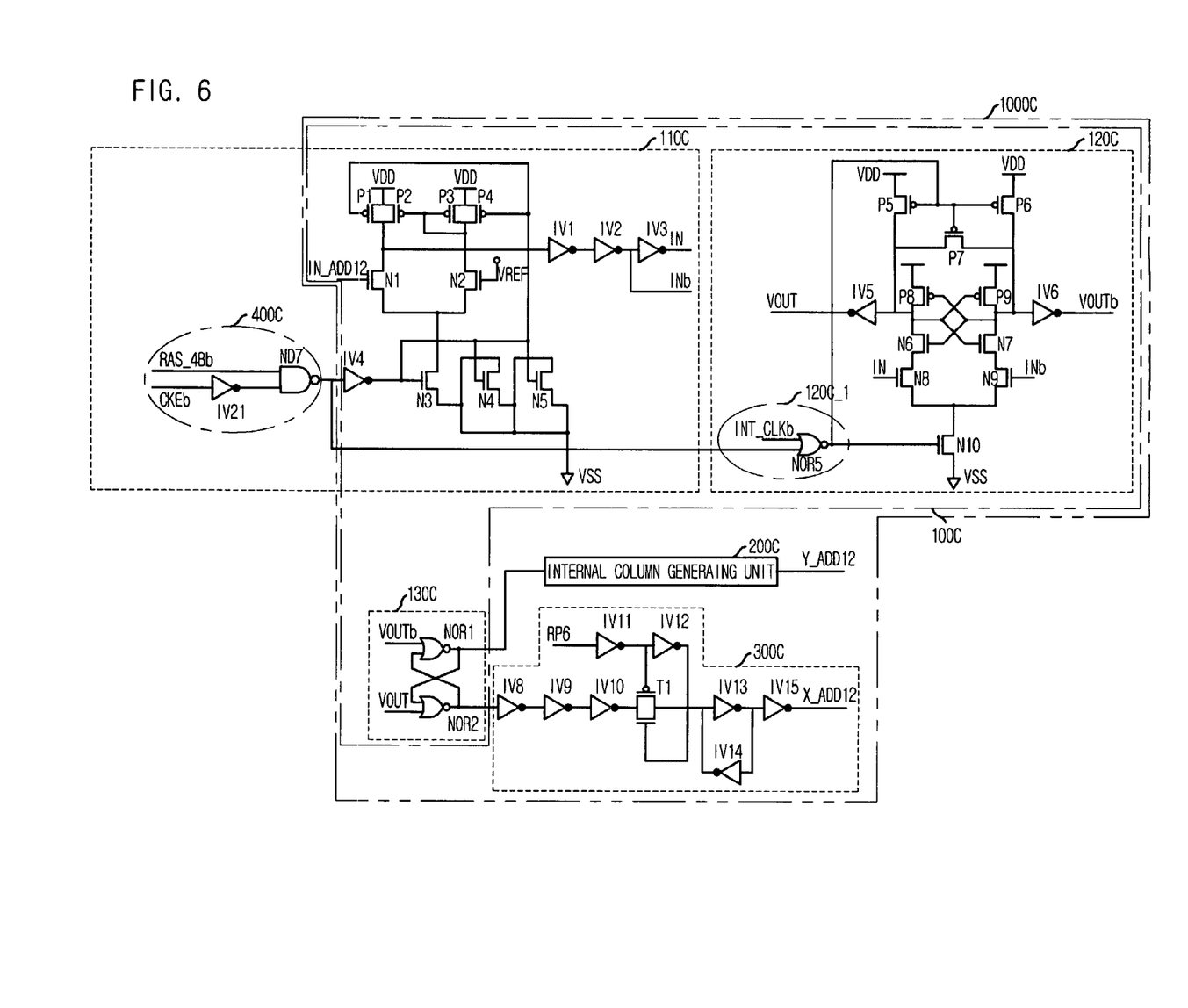
FIG. 6 is a schematic circuit diagram of a third address input block in FIG. 4.

FIG. 6 is a schematic circuit diagram of a third address input block in FIG. 4.

As shown in FIG. 6, the third address input block 1000C includes an address input unit 100C for transferring the address signal IN_ADD12 input from an external device, an internal column address generating unit 200C for receiving the transferred address signal by the address input unit 100C to generate the internal column address Y_ADD12, and an internal row address generating unit 300C for receiving the transferred address signal to generate the internal row address X_ADDD12. The second address control unit 400C selectively inactivates the address input block 1000C in response to the address input mode.

The third address control unit 400C includes a first inverter IV21 for inverting the clock enable signal CKEb and a first NAND logic gate ND7 for performing a NAND logical operation with an output of the first inverter IV21 and the row address control signal RAS_4Bb.

As described above, the row address control signal RAS_4Bb is a control signal inactivated when any one of all banks initiates at precharge mode.

The address control unit 400C controls the address input block 1000C to activate in response to an input of the row address. The address control unit 400C transfers the clock enable signal CKEb to the address input unit 100C in response to the row address control signal RAS_4Bb. An address input buffer unit 110C of the address input unit 100C is operated in response to the clock enable signal CKEb transferred by the address control unit 400C. An address latch unit 120C is operated in response to an output of a latch control unit 120C_1 wherein the latch control unit 120C_1 transfers the internal clock signal INT_CLKb in response to the transferred clock enable signal CKEb by the address control unit 400C.

Figure 7:
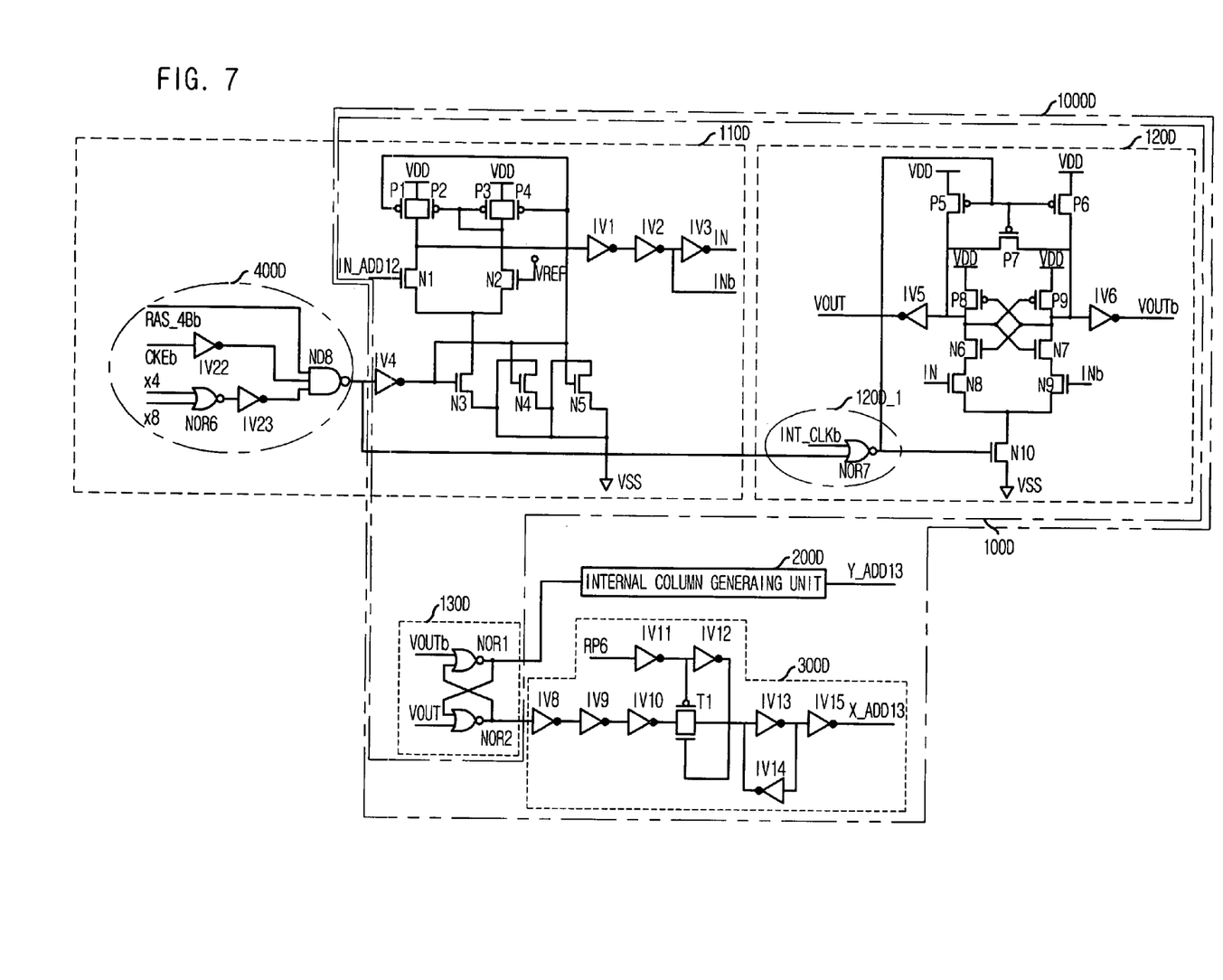
FIG. 7 is a schematic circuit diagram of a fourth address input block in FIG. 4.

FIG. 7 is a schematic circuit diagram is a fourth address input block in FIG. 4.

The third address input block 1000D includes the address input unit 100D for transferring the address signal IN_ADD13 input from an external device, an internal column address generating unit 200D for receiving the transferred address signal by the address input unit 100D to generate the internal column address Y_ADD13, an internal row address generating unit 300D for receiving the transferred address signal to generate the internal row address X_ADDD13. The second address control unit 400D selectively inactivates the address input block 1000D in response to at the first address output mode or the second address output mode.

The fourth address control unit 400D includes a first inverter IV22 for inverting the clock enable signal CKEb, a first NOR logic gate NOR6 for performing a NOR logical operation with the first data output mode control signal X4 and the second data output mode control signal X8, a second inverter IV23 for inverting an output of the first NOR logic gate NOR6 and a first NAND logic gate for performing a NAND logical operation with outputs of the first inverter IV22 and the second inverter IV23 and the row address control signal RAS_4Bb to thereby generate an enable signal for activating address input unit 100B.

As described above, the row address control signal RAS_4Bb is a control signal inactivated when any one of all banks initiates at precharge mode.

The address control unit 400D controls the address input block 1000D to activate in response to the first data output mode or the second data output mode. The address control unit 400D transfers the clock enable signal CKEb into the address input unit 100D in response to the row address control signal RAS_4Bb when the first data output mode control signal X4 or the second data output mode control signal X8 is activated. The address input buffer unit 110D of the address input unit 100D is operated in response to the clock enable signal CKEb transferred by the address control unit 400D. An address latch unit 120D is operated in response to an output of a latch control unit 120D_1 wherein the latch control unit 120D_1 transfers the internal clock signal INT_CLKb in response to the clock enable signal CKEb transferred by the address control unit 400D.

When the semiconductor memory device receives row addresses, the semiconductor memory device uses all of the fourteen address input blocks. When the semiconductor memory device receives column addresses, the semiconductor memory device uses parts of the fourteen address input blocks, i.e., address input blocks required by data output mode. Therefore, it is possible to reduce the current consumption during receipt of addresses, in particular column addresses.

The present application contains subject matter related to the Korean patent application nos. KR 2005-0090896 and KR 2006-0117135, filed in the Korean Patent Office on Sep. 29, 2005 and Dec. 2, 2005, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device having four banks, comprising:
   only one address input unit configured to input an address signal from an external device, and to transfer the address signal as a transferred address signal;
   an internal column address generating unit, connected to the address input unit, configured to receive the transferred address signal, and generate the transferred address signal as an internal column address;
   an internal row address generating unit, connected to the address input unit, configured to receive the transferred address signal and a row address control signal, logically combine the transferred address signal and the row address control signal after the transferred address signal is received by both the internal column address generating unit and the internal row address generating unit, and generate the combined signal as an internal row address; and
   an internal address control unit, connected to the internal row address generating unit, configured to generate the row address control signal for controlling the internal row address generating unit to be inactivated when all four bank active signals for respectively activating the four banks are activated.

2. The semiconductor memory device as recited in claim 1, wherein the internal address control unit generates the row address control signal for controlling the internal row address generating unit to be inactivated according to the activation of a read operation or a write operation.

3. The semiconductor memory device as recited in claim 1, wherein the internal address control unit generates the row address control signal for controlling the internal row address generating unit to be activated in response to an activated state of at least one bank in the semiconductor memory device.

4. The semiconductor memory device as recited in claim 1, wherein the internal address control unit includes:
   a first logic operating unit for performing a logical operation of the four bank active signals;
   a delay unit for delaying a first output from the first logic operating unit to thereby output a second output; and
   a second logic operating unit for performing a logical operation of the first output and the second output to thereby output the row address control signal for controlling the internal row address generating unit.

5. The semiconductor memory device as recited in claim 4, wherein the first logic operating unit includes:
   a first logic gate for performing a NAND operation of a first bank active signal and a second bank active signal;
   a second logic gate for performing a NAND operation of a third bank active signal and a fourth bank active signal; and
   a third logic gate for performing a NOR operation of an output of the first NAND logic gate and an output of the second logic gate, thereby providing the first output.

6. The semiconductor memory device as recited in claim 5, wherein the second logical operating unit includes:
   a fourth logic gate for performing a NAND operation of the first output and the second output; and
   a buffering unit for buffering an output of the fourth logic gate to output the row address control signal.

7. The semiconductor memory device as recited in claim 1, wherein the internal row address generating unit includes:
   a first logic operation unit configured to combine the transferred address signal and the row address control signal to generate the internal row address;
   a number of inverters configured to invert and delay the internal row address;
   a transfer gate configured to transfer the internal row address outputted from the inverters in response to a row command signal; and
   a latch circuit configured to latch the internal row address.

8. The semiconductor memory device as recited in claim 4, wherein the internal row address generating unit includes:
   a logic NAND gate configured to combine the transferred address signal and the row address control signal to generate the internal row address;
   a number of inverters configured to invert and delay the internal row address;
   a transfer gate configured to transfer the internal row address outputted from the inverters in response to a row command signal; and
   a latch circuit configured to latch the internal row address.

* * * * *